United States Patent [19]
Onuki

[11] Patent Number: 5,633,824
[45] Date of Patent: May 27, 1997

[54] FILE SYSTEM FOR FLASH MEMORY

[75] Inventor: Masato Onuki, Tokyo, Japan

[73] Assignee: NEC Corporation, Japan

[21] Appl. No.: 621,506

[22] Filed: Mar. 25, 1996

[30]  Foreign Application Priority Data

Mar. 30, 1995 [JP] Japan .................. 7-095819

[51] Int. Cl.$^6$ ................................ G11C 13/00
[52] U.S. Cl. .................. 365/185.33; 365/189.01
[58] Field of Search .............. 365/185.33, 189.01

[56]  References Cited

U.S. PATENT DOCUMENTS 5,065,364  11/1991  Atwood et al. .............. 365/185.33

FOREIGN PATENT DOCUMENTS 4-328394  11/1992  Japan .
5-173871   7/1993  Japan .

*Primary Examiner*—Terrell W. Fears
*Attorney, Agent, or Firm*—Ostrolenk, Faber, Gerb & Soffen, LLP

[57]  ABSTRACT

The invention provides a file system for a flash memory which is prevented from becoming disabled suddenly and wherein the time at which the flash memory itself should be exchanged can be estimated. A discrimination circuit discriminates whether or not a re-write occurrence time number of each physical block of the flash memory exceeds a guaranteed re-write time number by which writing can be performed regularly. When the discrimination of the discrimination circuit reveals that the re-write occurrence time number of any one of the physical blocks exceeds the guaranteed re-write time number, a searching circuit searches for a non-used alternate physical block which can be used in place of the one physical block. An alternate physical block production circuit copies described contents of the physical block, with which the re-write occurrence time number exceeds the guaranteed re-write time number, into the alternate physical block.

3 Claims, 5 Drawing Sheets

FILE SYSTEM FOR FLASH MEMORY

BACKGROUND OF THE INVENTION

1. Field of the Invention

This invention relates to a file system for a flash memory which writes and reads out data into and from the flash memory, for example, in a data exchange.

2. Description of the Related Art

Conventionally, in a file system in which a flash memory is used as a storage medium, reading out and writing operations of a file between a plurality of physical blocks formed in the flash memory and a plurality of logic blocks individually corresponding to the physical blocks of the flash memory are performed in the following manner by a flash memory read/write driver.

The file system itself calculates, when it tries to perform reading out or writing of data from or into a logic block controlled by it, a logic block designated by application software and an offset in the logic block and develops a read-out or write request to the flash memory read/write driver based on the thus calculated data.

The flash memory read/write driver refers to a correspondence table which describes a correspondence relationship between logic blocks and physical blocks of the flash memory to convert the designated logical block and the offset in the logic block into a physical block. Then, a corresponding physical block and an offset in the physical block are calculated, and contents of the logic block are read out and written into the physical block.

By the way, a flash memory has a limitation to the number of re-write times by which data can be written regularly into each physical block thereof.

However, since the conventional file system for a flash memory does not take the limitation to the number of re-write times described above into consideration, it has a drawback in that, when writing of a file so concentrates on a particular physical block that the number of times by which writing into the physical block occurs exceeds the limitation number of re-write times, the file system itself is disabled suddenly. It is to be noted that the limitation number of re-write times is an upper limit value to the number of times by which writing of a file into a physical block can be performed regularly.

Although a possible solution to the problem is to exchange the flash memory before the file system itself becomes disabled suddenly, it is impossible with the conventional file system to estimate the time at which the flash memory should be exchanged.

SUMMARY OF THE INVENTION

It is an object of the present invention to provide a file system for a flash memory which is prevented from becoming disabled suddenly.

It is another object of the present invention to provide a file system for a flash memory wherein the time at which the flash memory itself should be exchanged can be estimated.

In order to attain the objects described above, according to an aspect of the present invention, there is provided a file system for a flash memory having a storage region which is divided into a plurality of physical blocks, the file system writing, into one of the physical blocks, contents of logic blocks which correspond to the one physical block, the file system comprising discrimination means for discriminating whether or not a re-write occurrence time number of each of the physical blocks exceeds a guaranteed re-write time number by which writing can be performed regularly, searching means for searching, when the discrimination of the discrimination means reveals that the re-write occurrence time number of any one of the physical blocks exceeds the guaranteed re-write time number, for a non-used alternate physical block which can be used in place of the one physical block, and alternate physical block production means for copying described contents of the physical block, with which the re-write occurrence time number exceeds the guaranteed re-write time number, into the alternate physical block.

In the file system, if writing occurs with one of the physical blocks of the flash memory, then the discrimination means discriminates whether or not the re-write occurrence time number of the one physical block exceeds the guaranteed re-write time number by which writing can be performed regularly. When the discrimination of the discrimination means reveals that the re-write occurrence time number of the one physical block exceeds the guaranteed re-write time number, the searching means searches for a non-used alternate physical block which can be used in place of the one physical block. Then, the alternate physical block production means copies described contents of the physical block, with which the re-write occurrence time number exceeds the guaranteed re-write time number, into the alternate physical block.

With the file system, before the re-write occurrence time number of a certain physical block exceeds the guaranteed re-write time number, another non-used physical block can be used in place of the physical block. Consequently, the file system can prevent such a situation that it is disabled suddenly.

According to another aspect of the present invention, there is provided a file system for a flash memory having a storage region which is divided into a plurality of physical blocks, the file system referring to a correspondence table, in which a correspondence relationship between the physical blocks and logical blocks corresponding to the physical blocks is described, to write, into one of the physical blocks, contents of those logic blocks which correspond to the one physical block, the file system comprising discrimination means for discriminating whether or not a re-write occurrence time number of each of the physical blocks exceeds a guaranteed re-write time number by which writing can be performed regularly, searching means for searching, when the discrimination of the discrimination means reveals that the re-write occurrence time number of any one of the physical blocks exceeds the guaranteed re-write time number, for a non-used alternate physical block which can be used in place of the one physical block, and re-writing means for copying described contents of the physical block, with which the re-write occurrence time number exceeds the guaranteed re-write time number, into the alternate physical block and re-writing the correspondence relationship described in the correspondence table so that writing into the one physical block may not thereafter occur.

In the file system, if writing occurs with one of the physical blocks of the flash memory, then the discrimination means discriminates whether or not the re-write occurrence time number of the one physical block exceeds the guaranteed re-write time number by which writing can be performed regularly. When the discrimination of the discrimination means reveals that the re-write occurrence time number of the one physical block exceeds the guaranteed re-write time number, the searching means searches for a non-used alternate physical block which can be used in place of the one physical block. Then, the re-writing means copies described contents of the physical block, with which the re-write occurrence time number exceeds the guaranteed re-write time number, into the alternate physical block. Further, the re-writing means re-writes the correspondence relationship described in the correspondence table.

With the file system, before the re-write occurrence time number of a certain physical block exceeds the guaranteed re-write time number, another non-used physical block can be used in place of the physical block. Consequently, the file system can prevent such a situation that it is disabled suddenly.

According to a further aspect of the present invention, there is provided a file system for a flash memory having a storage region which is divided into a plurality of physical blocks, the file system referring to a correspondence table, in which a correspondence relationship between the physical blocks and logical blocks corresponding to the physical blocks is described, to write, into one of the physical blocks, contents of those logic blocks which correspond to the one physical block, the file system comprising a physical block re-write counter for counting re-write occurrence time numbers individually for the physical blocks, discrimination means for incrementing, each time writing occurs with one of the physical blocks, the count value of the physical block re-write counter for the one physical block and discriminating whether or not the count value of the physical block re-write counter for the one physical block exceeds a guaranteed re-write time number by which writing can be performed regularly, searching means for searching, when the count value exceeds the guaranteed re-write time number, for a non-used alternate physical block which can be used in place of the one physical block, an alternate block counter for counting a number of those alternate physical blocks, and re-writing means for incrementing the alternate block counter, copying described contents of the physical block, with which the re-write occurrence time number exceeds the guaranteed re-write time number, into the alternate physical block and re-writing the correspondence relationship described in the correspondence table so that writing into the one physical block may not thereafter occur.

In the file system, if writing occurs with one of the physical blocks of the flash memory, then the physical block re-write counter counts the re-write occurrence time number of the one physical block and discriminates whether or not the count value exceeds the guaranteed re-write time number by which writing can be performed regularly. When the count value exceeds the guaranteed re-write time number, the searching means searches for a non-used alternate physical block which can be used in place of the one physical block. Then, the alternate block counter is incremented, and the re-writing means copies described contents of the physical block, with which the re-write occurrence time number exceeds the guaranteed re-write time number, into the alternate physical block. Further, the re-writing means re-writes the correspondence relationship described in the correspondence table so that writing into the one physical block may not thereafter occur.

With the file system, since the total number of physical blocks is known, the number of remaining usable physical blocks can be detected by referring to the count value of alternate physical blocks, that is, the number of physical blocks which have been disabled. Consequently, the time at which the flash memory should be replaced can be estimated.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENT

Figure 1:
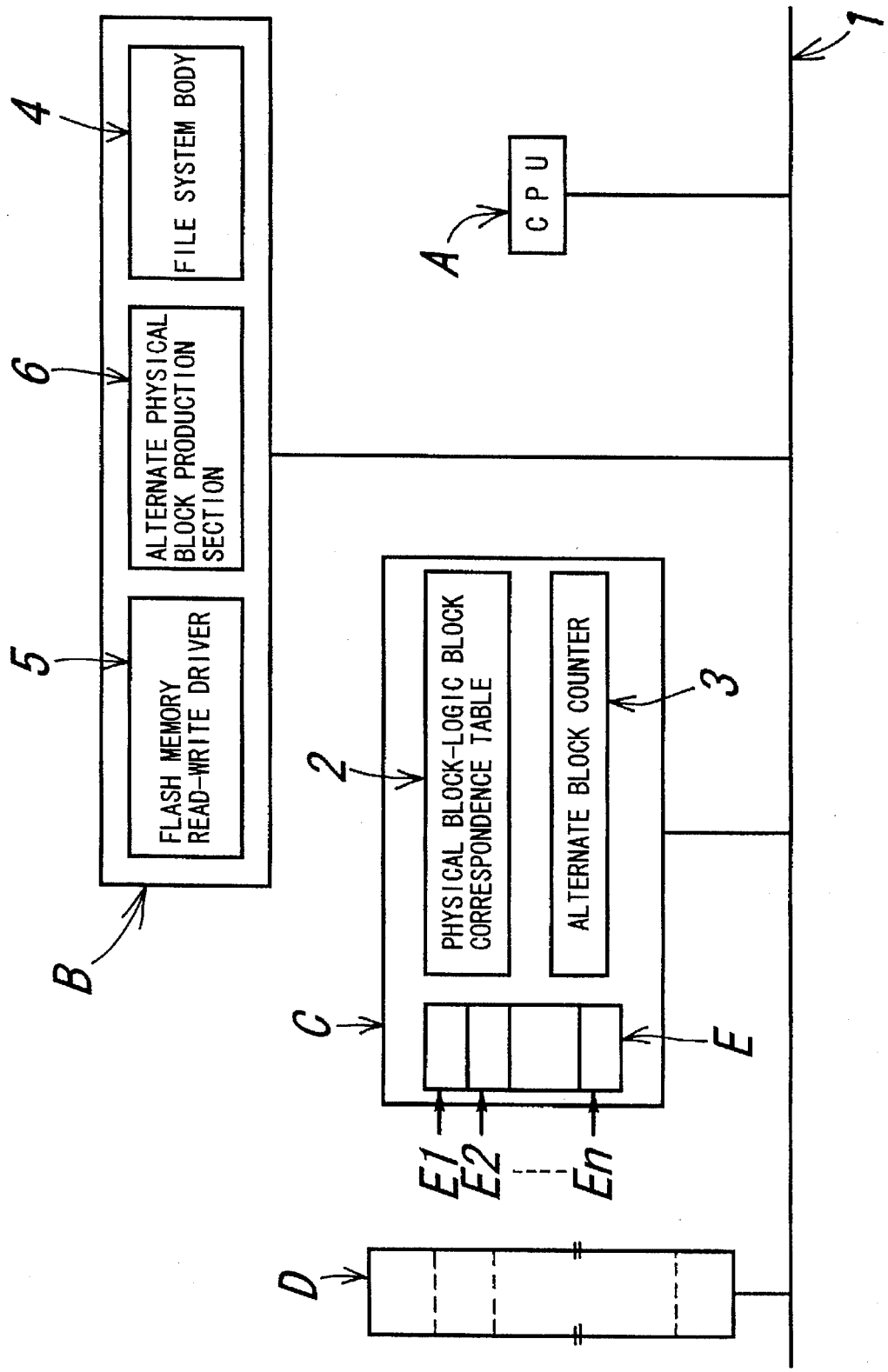
FIG. 1 is a block diagram showing a general construction of a file system for a flash memory to which the present invention is applied.

Referring first to FIG. 1, there is shown in block diagram a general construction of a file system for a flash memory to which the present invention is applied. The file system shown includes a central processing unit (CPU) A, a main memory B, a non-volatile read-write memory C and a flash memory D which are connected to each other via a common bus line 1.

Figure 2:
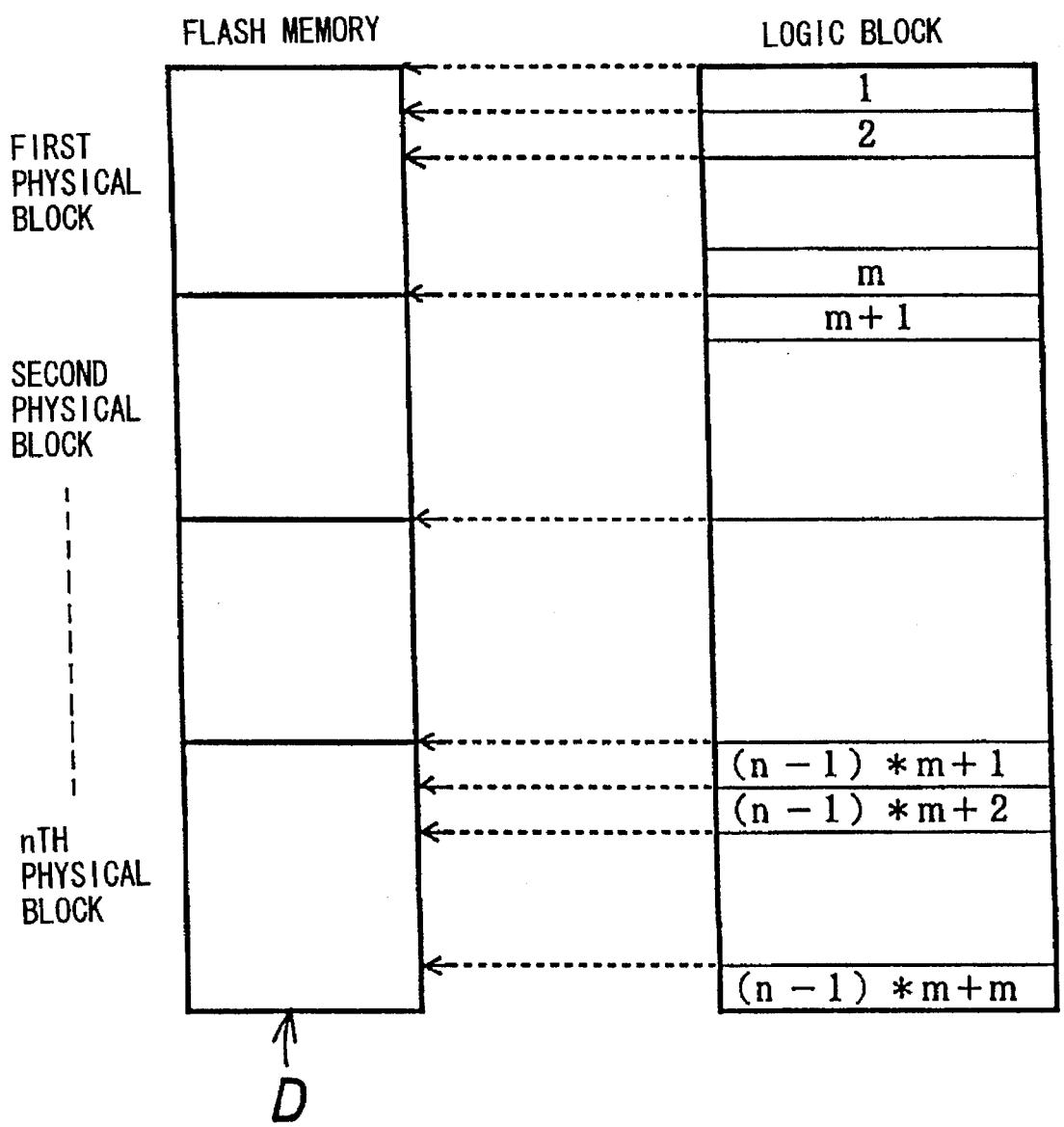
FIG. 2 is a diagrammatic view illustrating a correspondence relationship between logic blocks and physical blocks in the file system for a flash memory of FIG. 1 when the numbers of re-write occurrence times of all of the physical blocks are lower than a guaranteed re-write number of times.

Referring to FIG. 2, the flash memory D has a storage region which is divided into n physical blocks of the first to nth physical blocks, and m logic blocks correspond to each of the physical blocks.

It is to be noted that reference characters $(n-1)*m+1$ to $(n-1)*m+m$ in FIG. 2 represent the number of logic blocks corresponding to the nth physical block and individually indicate the sequential numbers of the logic blocks.

Referring back to FIG. 1, the non-volatile read-write memory C may be, for example, a backed up random access memory (RAM). The non-volatile read-write memory C stores therein a physical block-logic block correspondence table (hereinafter referred to merely as correspondence table) 2 which describes a correspondence relationship between the physical blocks and the logic blocks described above, a physical block re-write counter E for counting the numbers of re-write occurrence times of the individual physical blocks, and an alternate block counter 3.

The physical block re-write counter E includes counter memories E1 to En corresponding to the first to nth physical blocks which count the numbers of re-write occurrence times of the corresponding physical blocks.

The alternate block counter 3 counts the number of alternate physical blocks with which those physical blocks with which re-writing occurs by more than the guaranteed re-write time number are replaced. Further, by referring to the total physical block number n and the count value of alternate physical blocks, the number n of remaining free or usable physical blocks can be calculated and make a criterion for the time at which the flash memory D itself should be exchanged.

The main memory B stores a file system body 4 in the form of a program, a flash memory read-write driver 5, and an alternate physical block production section 6.

The file system body 4 has a function of calculating, in response to a request from application software, a required logic block and an offset in the logic block and inquiring the flash memory read-write driver 5 for reading out or writing.

It is to be noted that, when a file is to be produced, the file system body 4 uses the logic blocks beginning with a non-used logic block of a minimum logic block number. Accordingly, also physical blocks corresponding to logic blocks are used beginning with a non-used logic block of minimum physical block number.

The flash memory read-write driver 5 has the following functions:

① A function of referring to the correspondence table 2 stored in the non-volatile memory C based on a logic block and an offset In the logic block calculated by the file system body 4 to find out a physical block and an offset in the physical block corresponding to the logic block and the offset in the logic block, respectively, and performing reading out from or writing into the physical block;

② Another function of incrementing, each time writing occurs for any of the physical blocks, the count value of the physical block re-write counter E for the physical block to count the number of re-write occurrence times and discriminating whether or not the re-write occurrence time number exceed the number of guaranteed re-write times; and ③ A further function of notifying, when the re-write occurrence time number exceeds the guaranteed re-write time number, such excess to the alternate physical block production section 6 which will be described below.

The alternate physical block production section 6 has the following functions:

① A function as a searching element of searching, when any of the re-write occurrence time numbers exceeds the guaranteed re-write time number, a non-used alternate physical block which can be used in place of the physical block with which the guaranteed re-write time number has been exceeded.

Whether a physical block is a non-used alternate physical block can be confirmed, for example, by referring to a file allocation table of the alternate physical block or the like or confirming a use condition of logic blocks corresponding to the alternate physical block.

② Another function as a re-writing element of copying described contents of the physical block with which the re-write occurrence time number exceeds the guaranteed re-write time number into the alternate physical block and re-writing the correspondence relationship described in the correspondence table 2 so that writing into the physical block may not thereafter be performed.

Subsequently, operation of the system described above will be described with reference to FIGS. 3 to 5.

When data are to be written into a file, the application software inquires the file system body 4 for writing of a file.

The file system body 4 determines a logic block controlled by itself based on the designated file, calculates an offset in the logic block to determine a writing location of the logic block, and delivers data to be written, the logic block and the offset in the logic block to the flash memory read-write driver 5 to inquire the flash memory read-write driver 5 for writing of the data.

Figure 4:
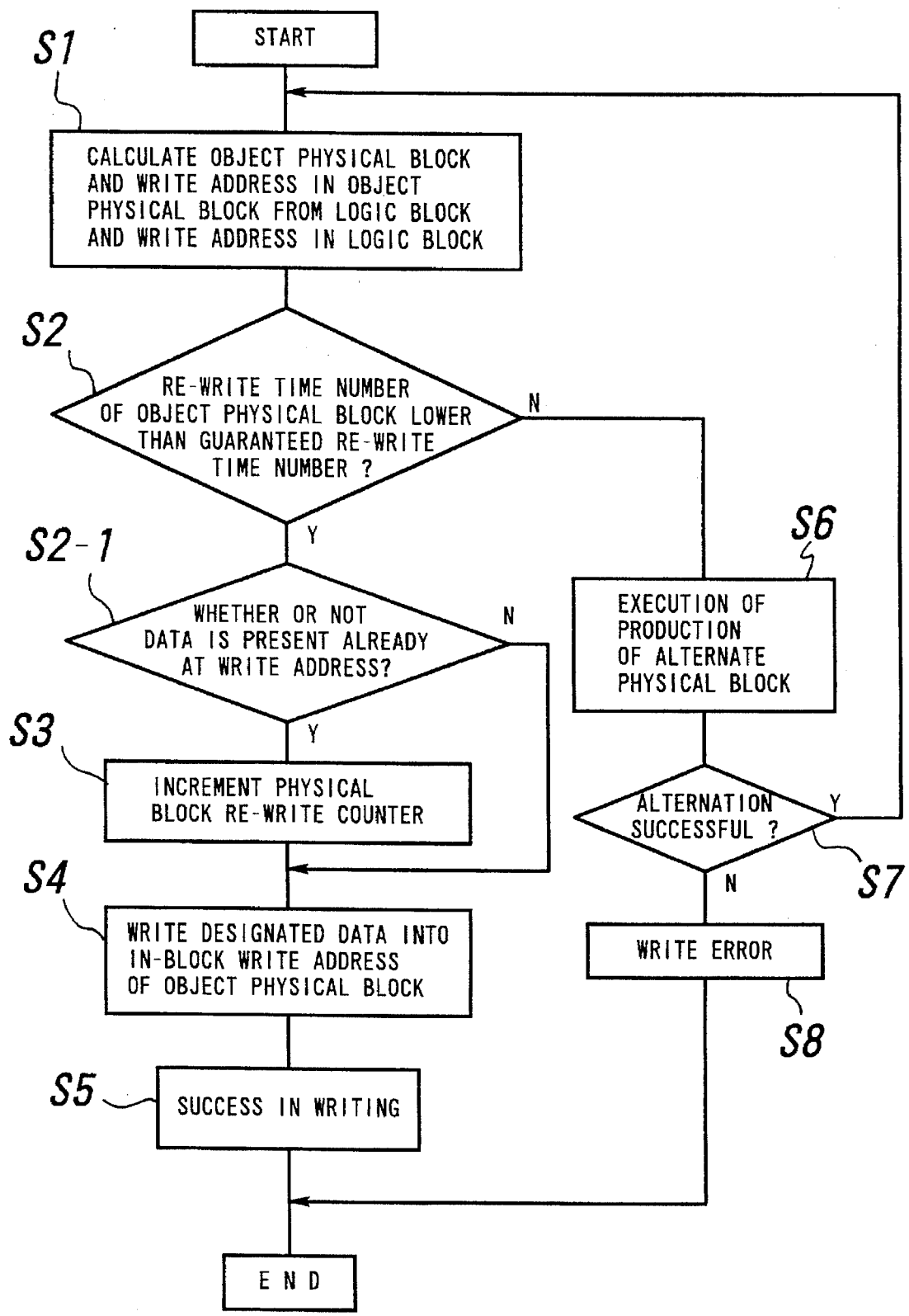
FIG. 4 is a flow chart illustrating processing of a flash memory write driver of the file system for a flash memory of FIG. 1.

Referring to FIG. 4, the processing operation of the flash memory read-write driver 5 proceeds in the following manner.

Step 1: The flash memory read-write driver 5 first refers to the correspondence table 2 to find out a logic block and a write address in the logic block specified by a logic block and an offset in the logic block and calculates a physical block and a write address in the physical block corresponding to them, respectively.

Step 2: The flash memory read-write driver 5 discriminates whether or not the re-write occurrence time number of the physical block with which writing has occurred is equal to or lower than the guaranteed re-write time number. If the re-write occurrence time number is equal to or lower than the guaranteed re-write time number, then the control sequence advances to step S2-1, but if the re-write occurrence time number is higher than the guaranteed re-write time number, then the control sequence jumps to step S6.

Step S2-1: It is discriminated whether or not data is present already at the write address. If no data is present at the write address, then the control sequence jumps to step S4, but if some data is present at the write address, then the control sequence advances to step S3.

Step S3: The counter memory of the physical block re-write counter corresponding to the physical block is incremented.

Step S4: The designated data are written into the in-block write address of the physical block.

Step S5: The flash memory read-write driver 5 determines that the data have been written successfully. Then, the flash memory read-write driver 5 ends its processing.

Step S6: The alternate physical block production section 6 is called to perform alternation processing which will be hereinafter described.

Step S7: If the alternation processing has been performed successfully, then the control sequence returns to step S1, but if the alternation processing has not been performed successfully, then the control sequence advances to step S8.

Step S8: The flash memory read-write driver 5 determines that a write error has occurred. Then, the flash memory read-write driver 5 ends its processing.

Figure 5:
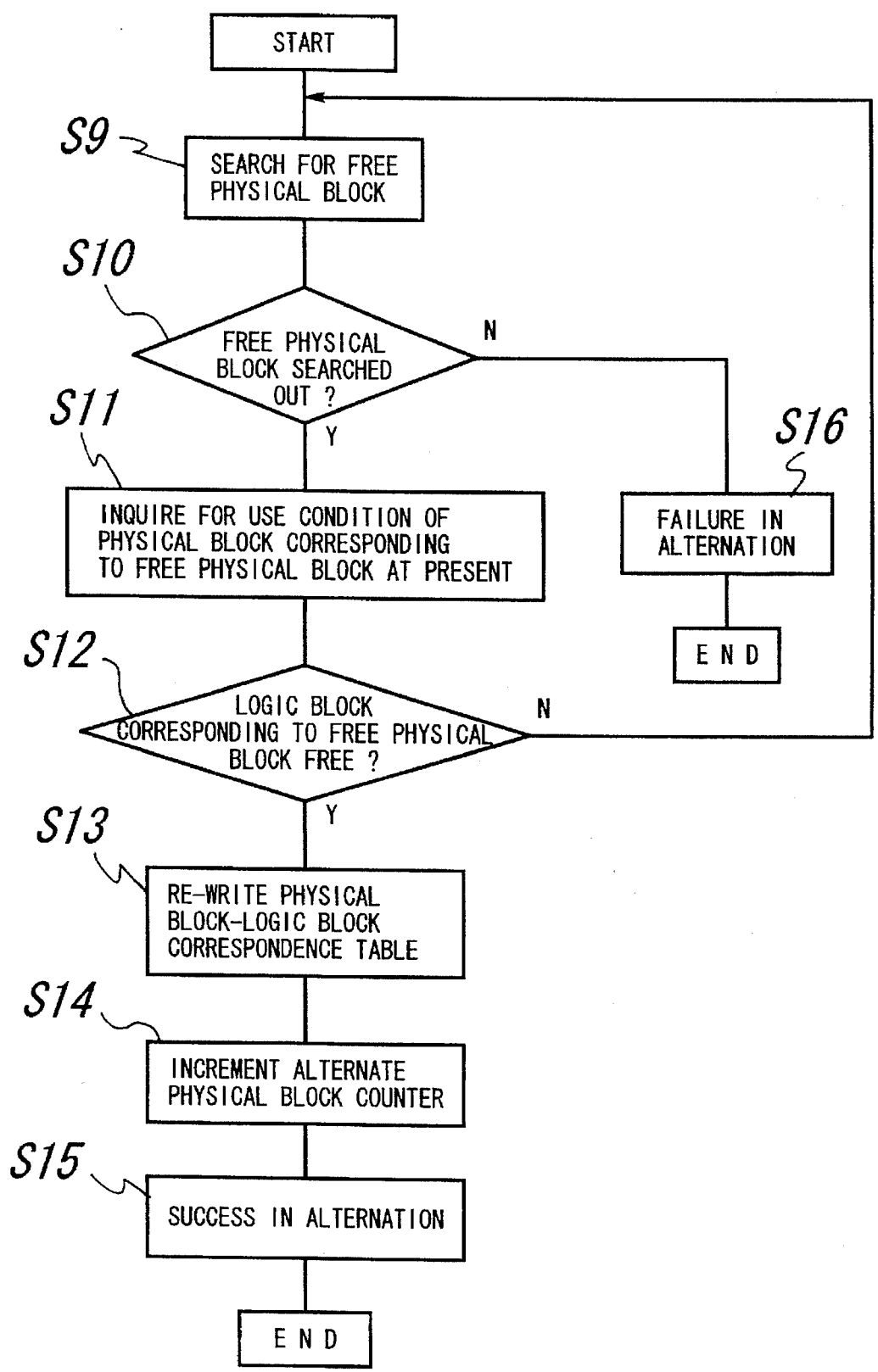
FIG. 5 is a flow chart illustrating processing of an alternate physical block production section of the file system for a flash memory of FIG. 1.

Referring now to FIG. 5, the alternation processing of the alternate physical block production section 6 at step S6 particularly proceeds in the following manner.

Step S9: The alternate physical block production section 6 searches for a non-used alternate physical block.

Step S10: If an alternate physical block has been searched out, then the control sequence advances to step S11. But if no alternate physical block has been searched out, then the control sequence advances to step S16, at which it determines that the alternation processing has failed and stops its processing.

Step S11: The alternate physical block production section 6 inquires the file system body 4 for a use condition of a logical block which corresponds to the alternate physical block.

Step S12: If the logic block corresponding to the alternate physical block is not used, then the control sequence advances to step S13. On the other hand, if the logic block is used, then the control sequence returns to step S9 to search for a next alternate physical block.

Step S13: The correspondence table 2 is re-written.

The re-writing processing of the correspondence table 2 particularly proceeds in the following manner.

For example, if the re-write occurrence time numbers of the first to nth physical blocks are all equal to or lower than the guaranteed re-write time number, then m logic blocks correspond to each of the first to nth physical blocks. Consequently, to the nth physical block, the logic blocks $(n-1)*m+1$ to $(n-1)*m+m$ correspond.

Figure 3:
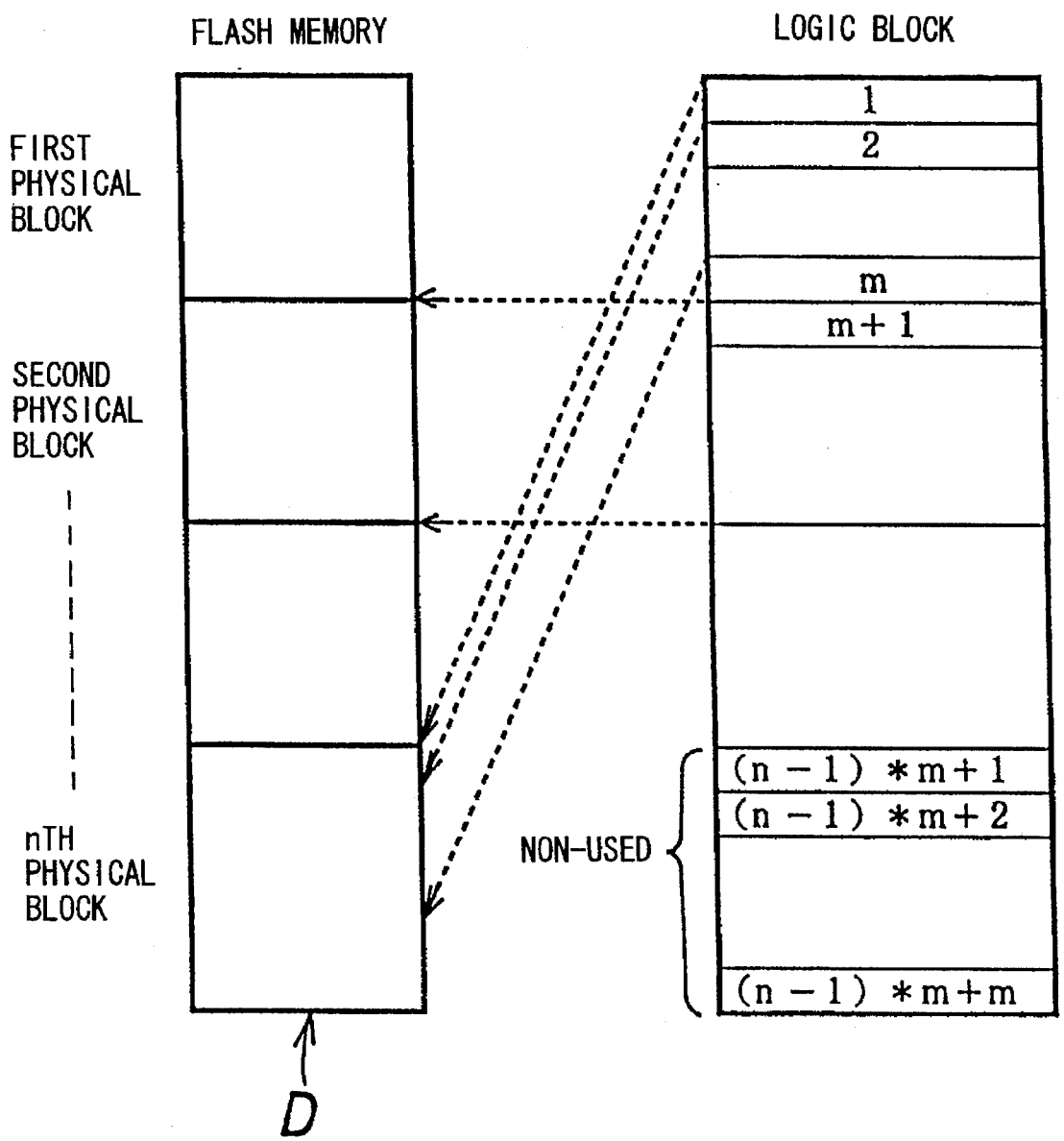
FIG. 3 is a diagrammatic view illustrating a condition of the file system for a flash memory in which the nth physical block is used as an alternate physical block corresponding to the first to mth logical blocks.

Then, if repetitive re-writing occurs until the re-write occurrence time number of, for example, the first physical block exceeds the guaranteed re-write time number, then if the logic blocks (n−1)*m+1 to (n−1)*m+m are not used, then the described contents of the correspondence table 2 are re-written such that the logic blocks 1 to m which have been corresponding to the first physical block now correspond to the nth physical block whereas the logic blocks (n−1)*m+1 to (n−1)*m+m which have been corresponding to the nth physical block now correspond to no physical block as seen in FIG. 3.

Step S14: The alternate block counter 3 is incremented.

Step S15: The alternate physical block production section 6 determines that the alternation processing has been performed successfully, and ends its processing.

Having now fully described the invention, it will be apparent to one of ordinary skill in the art that many changes and modifications can be made thereto without departing from the spirit and scope of the invention as set forth herein.

What is claimed is:

1. A file system for a flash memory having a storage region which is divided into a plurality of physical blocks, said file system writing, into one of said physical blocks, contents of logic blocks which correspond to the one physical block, said file system comprising:

discrimination means for discriminating whether or not a re-write occurrence time number of each of said physical blocks exceeds a guaranteed re-write time number by which writing can be performed regularly;

searching means for searching, when the discrimination of said discrimination means reveals that the re-write occurrence time number of any one of said physical blocks exceeds the guaranteed re-write time number, for a non-used alternate physical block which can be used in place of the one physical block; and alternate physical block production means for copying described contents of the physical block, with which the re-write occurrence time number exceeds the guaranteed re-write time number, into the alternate physical block.

2. A file system for a flash memory having a storage region which is divided into a plurality of physical blocks, said file system referring to a correspondence table, in which a correspondence relationship between said physical blocks and logical blocks corresponding to said physical blocks is described, to write, into one of said physical blocks, contents of those logic blocks which correspond to the one physical block, said file system comprising:

discrimination means for discriminating whether or not a re-write occurrence time number of each of said physical blocks exceeds a guaranteed re-write time number by which writing can be performed regularly;

searching means for searching, when the discrimination of said discrimination means reveals that the re-write occurrence time number of any one of said physical blocks exceeds the guaranteed re-write time number, for a non-used alternate physical block which can be used in place of the one physical block; and re-writing means for copying described contents of the physical block, with which the re-write occurrence time number exceeds the guaranteed re-write time number, into the alternate physical block and re-writing the correspondence relationship described in said correspondence table so that writing into the one physical block may not thereafter occur.

3. A file system for a flash memory having a storage region which is divided into a plurality of physical blocks, said file system referring to a correspondence table, in which a correspondence relationship between said physical blocks and logical blocks corresponding to said physical blocks is described, to write, into one of said physical blocks, contents of those logic blocks which correspond to the one physical block, said file system comprising:

a physical block re-write counter for counting re-write occurrence time numbers individually for said physical blocks;

discrimination means for incrementing, each time writing occurs with one of said physical blocks, the count value of said physical block re-write counter for the one physical block and discriminating whether or not the count value of said physical block re-write counter for the one physical block exceeds a guaranteed re-write time number by which writing can be performed regularly;

searching means for searching, when the count value exceeds the guaranteed re-write time number, for a non-used alternate physical block which can be used in place of the one physical block;

an alternate block counter for counting a number of those alternate physical blocks; and re-writing means for incrementing said alternate block counter, copying described contents of the physical block, with which the re-write occurrence time number exceeds the guaranteed re-write time number, into the alternate physical block and re-writing the correspondence relationship described in said correspondence table so that writing into the one physical block may not thereafter occur.

* * * * *